(12) United States Patent
Hashiguchi

(10) Patent No.: US 6,860,204 B2
(45) Date of Patent: Mar. 1, 2005

(54) IMAGE EXPOSURE APPARATUS

(75) Inventor: Akihiro Hashiguchi, Kanagawa (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/700,563

(22) Filed: Nov. 5, 2003

(65) Prior Publication Data

US 2004/0099168 A1 May 27, 2004

(30) Foreign Application Priority Data

Nov. 26, 2002 (JP) .................................. 2002-342679

(51) Int. Cl.⁷ .............................................. B41F 27/00
(52) U.S. Cl. .................... 101/486; 101/477; 101/415.1; 271/238; 271/250
(58) Field of Search ................................ 101/486, 477, 101/415.1, 409; 271/238, 250

(56) References Cited

U.S. PATENT DOCUMENTS

| 4,727,806 | A | * | 3/1988 | Green, Sr. ............... 101/415.1 |
| 5,255,607 | A | * | 10/1993 | Nishiyama et al. ...... 101/463.1 |
| 5,479,858 | A | * | 1/1996 | Beisel et al. ............. 101/477 |
| 6,418,849 | B1 | * | 7/2002 | Fukui ......................... 101/409 |
| 6,474,236 | B1 | * | 11/2002 | Naniwa et al. ............. 101/477 |
| 6,766,742 | B2 | * | 7/2004 | Hashiguchi ................ 101/477 |

FOREIGN PATENT DOCUMENTS

JP         2001-356489 A         12/2001

* cited by examiner

*Primary Examiner*—Eugene H. Eickholt
(74) *Attorney, Agent, or Firm*—Sughrue Mion, PLLC

(57) ABSTRACT

An image exposure apparatus has a rotating drum for winding a printing plate on which an image is recorded; a punch unit for forming punched holes to be used for positioning in printing processing on the printing plate; a conveying guide unit having a guide section that selectively moves to a first position facing the punch unit and a second position facing the rotating drum to guide a printing plate to the selected position so as to supply the printing plate; a width direction moving unit for moving in a width direction while a conveying pin is in contact with a width direction edge of the printing plate that is put on the conveying guide unit; a reference pin moving unit having a reference pin disposed at an opposite side of the width direction moving unit for defining the width direction edge of the printing plate, the reference pin moving unit moving the reference pin in accordance with a size of the printing plate; and a home position sensor mounted on a fixing portion independently of the conveying guide unit for detecting a home position of the reference pin.

5 Claims, 9 Drawing Sheets

IMAGE EXPOSURE APPARATUS

BACKGROUND OF THE INVENTION

1. Field of the Invention

The present invention relates to an image recording apparatus for recording an image on a printing plate, and particularly to an image exposure apparatus having a mechanism for performing the positioning in a state that the printing plate is put on a plate feed guide.

2. Description of the Related Art

The conventional image exposure apparatus is to record (expose) an image on a printing plate consisting of an aluminum foil sheet. In the image exposure apparatus, a plate feed conveying section is provided with a reversing unit and a conveyer. The reversing unit transmits to the conveyer a printing plate drawn out from a cassette through rolling up on a reversing roller. The conveyer conveys obliquely below the printing plate put on a conveying belt while supporting the printing plate in cooperation with the roller so that the top of the printing plate is in contact with a pin roller. When the printing plate is in contact with the pin roller, the plate feed conveying section causes a positioning motor to operate so that the reversing unit moves together with the conveyer on a parallel basis. Thus, the printing plate is in contact with the pin roller to perform the positioning of the printing plate. The printing plate subjected to the positioning is fed to a puncher by the conveyer in the leading edge (cf. for example, Japanese Patent Application Laid Open Gazette TokuKai. 2001-356489 (Page 1, FIG. 2).

According to the image exposure apparatus as mentioned above, the printing plate, which is put on a plate feed guide formed as a plate, is conveyed to a punch section to form punched holes on the printing plate through performing a punch processing. The punched holes are used for a determination of positioning in a printing processing, which is the continuation step. The printing plate, which is put on the plate feed guide, is conveyed to an exposure section and is wound on a rotating drum of the exposure section. Then the printing plate is subjected to an exposure processing.

By the way, there is a necessity for making sure of reproduction quality of exposure recording positions, in which the exposure recording positions on a plurality of printing plates are given with uniformity in its entirety. For this reason, before the exposure processing by the exposure section, there is performed the following positioning in a state that the printing plate is put on the plate feed guide.

As shown in FIG. 9, there is performed a first positioning in such a manner that a printing plate 12 is put on a plate feed guide 20, a front edge of the printing plate 12 is in contact with a pair of positioning pins 48 located in the vicinity of a punch section (not illustrated), the printing plate 12 is conveyed in a horizontal direction through pushing a left end edge of the printing plate 12 by a conveying pin 42, and a right end edge of the printing plate 12 is contact with a reference pin 36 provided on the plate feed guide 20. At this position, there are formed punched holes 49a and 49b in the front edge portion of the printing plate 12. Next, after the front edge portion of the plate feed guide 20 is rotatably moved to be lowered, there is performed a second positioning in such a manner that the front edge of the printing plate 12 is in contact with at least a pair of positioning pins 52 provided on a rotating drum (not illustrated), and the right end edge of the printing plate 12 is in contact with the reference pin 36 provided on the plate feed guide 20. Thereafter, the printing plate 12 is wound on the rotating drum to perform the exposure processing.

Since the printing plates 12 are different in their size, there is a need that the reference pin 36 alters its position to meet a size of the plate. For example, the smaller size of the printing plate, the reference pin 36 is located more inside (the nearer left in FIG. 9) the plate feed guide 20. For this reason, a starting position of the reference pin 36 is detected by a home position sensor S1 or S2, and the reference pin 36 is moved inside by a predetermined distance from the position of the home position sensor S1 or S2 so that the reference pin 36 is set up to a position according to the size of the printing plate.

As mentioned above, the plate feed guide 20 reciprocates between a position (a) of FIG. 9 and a position (b) of FIG. 9 in which the plate feed guide 20 rotatably moves in such a manner that the front portion is lowered. Owing to variation (because of variation of the reciprocating track by mechanical errors and other causes) of reproduction quality of exposure recording positions when the rotatable movement operation is repeated, it is difficult to expect a complete coincidence of the position of the plate feed guide 20 between the position (a) of FIG. 9 and the position (b) of FIG. 9. And thus it may happen that variation (several tens to several hundreds of $\mu$ meters) of minor discrepancy $\Delta x$ is generated. With the discrepancy of the plate feed guide 20, the home position sensor S1 or S2 also shifts by the same amount $\Delta x$, and thus the reference pin 36 also shifts by the same amount $\Delta x$. As a result, the printing plate 12 also shifts by $\Delta x$ in a punch position and an exposure position, so that the punched holes 49a and 49b are wound on the rotating drum and exposed in a state that the punched holes 49a and 49b also shift by $\Delta x$.

The reproduction quality of positions of an image on the printing plate 12 needs about $50\mu$ meters or less where a position of a punched hole on the printing plate 12 is selected as the criterion. Thus, in some variation due to mechanical errors and the like of the plate feed guide 20, it would be difficult to make sure of the reproduction quality of positions of an image.

SUMMARY OF THE INVENTION

In view of the foregoing, it is an object of the present invention to provide an image exposure apparatus capable of exactly set up a starting position of the reference pin regardless of variation of the reproduction quality of positions of the plate feed guide and also capable of ensuring the reproduction quality of positions of the printing plate.

To achieve the above-mentioned object, the present invention provides an image exposure apparatus comprising:

a rotating drum for winding a printing plate on which an image is recorded;

a punch unit for forming punched holes to be used for positioning in printing processing on the printing plate;

a conveying guide unit having a guide section that selectively moves to a first position facing the punch unit and a second position facing the rotating drum to guide a printing plate to the selected position so as to supply the printing plate;

a pair of first positioning pins against which a front edge of the printing plate bumps when the conveying guide unit is located at the first position;

a pair of second positioning pins against which the front edge of the printing plate bumps when the conveying guide unit is located at the second position;

a width direction moving unit for moving in a width direction while a conveying pin is in contact with a width direction edge of the printing plate that is put on the conveying guide unit;

a reference pin moving unit having a reference pin disposed at an opposite side of the width direction moving unit for defining the width direction edge of the printing plate, the reference pin moving unit moving the reference pin in accordance with a size of the printing plate; and a home position sensor mounted on a fixing portion independently of the conveying guide unit for detecting a home position of the reference pin.

According to the image exposure apparatus of the present invention, when the printing plate is put on the plate feed guide, the reference pin moving unit is driven and the home position sensor detects the a home position, so that the reference pin is set up to the home position. Movement of the reference pin by a predetermined distance makes it possible to set up the position of the reference pin to meet the size of the printing plate. The width direction moving unit moves in a width direction while a conveying pin is in contact with a width direction edge of the printing plate that is put on the conveying guide unit. The edge of the opposite side of the printing plate bumps the reference pin. In this manner, the position of the printing plate in the width direction is determined. Thus the positioning of the printing plate at the time of punching is carried out in the state that the printing plate is put on the plate feed guide, and the positioning at the winding position on the rotating drum rotatably moving in the direction that the plate feed guide is lowered is carried out.

According to the present invention, the home position sensor for detecting a home position of the reference pin is mounted on a fixing portion independently of the conveying guide unit. Therefore, the relative position of the reference pin to the first positioning pins against which a front edge of the printing plate bumps when the conveying guide unit is located at the first position as the punch position is equal to the relative position of the reference pin to the second positioning pins against which the front edge of the printing plate bumps when the conveying guide unit is located at the second position as the rotating drum. Thus, an image exposure apparatus according to the present invention has no effect on the rotatable movement of the conveying guide unit. Accordingly, it is possible to exactly set up the home position of the reference pin regardless of the mechanical errors of the conveying guide unit, and also to make sure of the reproduction quality of image positions to punched holes for positioning in the printing processing by the printing apparatus on the printing plate, and thereby ensuring the reproduction quality of image positions of the printing plates by the rotating drum with greater accuracy.

In the image exposure apparatus according to the present invention as mentioned above, it is preferable that the home position sensor comprises a first home position sensor for detecting the home position of the reference pin where the conveying guide unit is located at the first position, and a second home position sensor for detecting the home position of the reference pin where the conveying guide unit is located at the second position.

In the image exposure apparatus according to the present invention as mentioned above, it is preferable that the reference pin carries out a positioning for the printing plate with three points including the first positioning pin in cooperation with the first positioning pin when the conveying guide unit is located at the first position.

In the image exposure apparatus according to the present invention as mentioned above, it is preferable that the reference pin carries out a positioning for the printing plate with three points including the second positioning pin in cooperation with the second positioning pin when the conveying guide unit is located at the second position.

In the image exposure apparatus according to the present invention as mentioned above, it is preferable that the reference pin moves a position in which a relative position to the first positioning pin when the conveying guide unit is located at the first position is equal to a relative position to the second positioning pin when the conveying guide unit is located at the second position.

DETAILED DESCRIPTION OF PREFERRED EMBODIMENTS

Embodiments of the present invention will be described with reference to the accompanying drawings.

Figure 1:
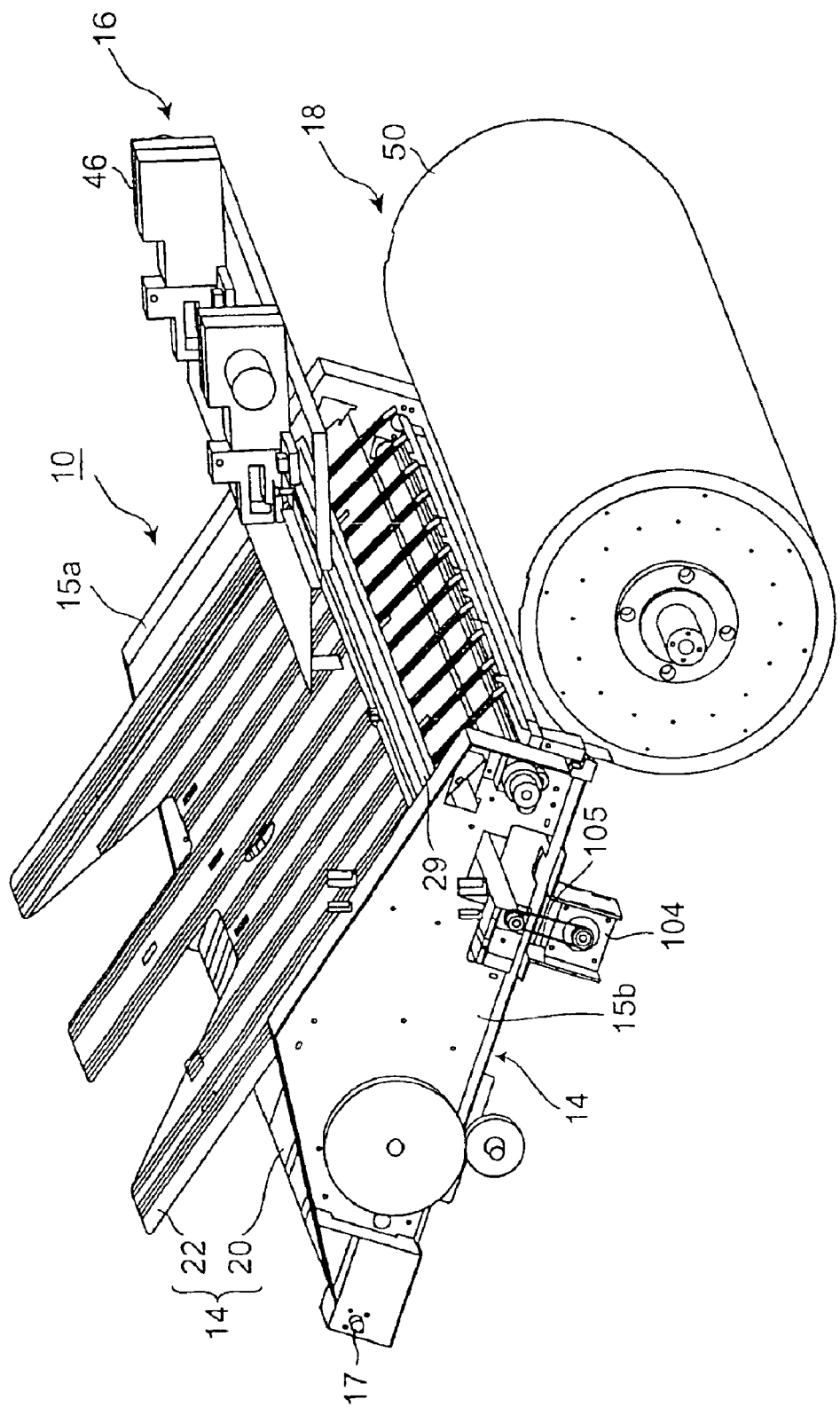
FIG. 1 is a perspective view of an image exposure apparatus according to an embodiment of the present invention.
Figure 2:
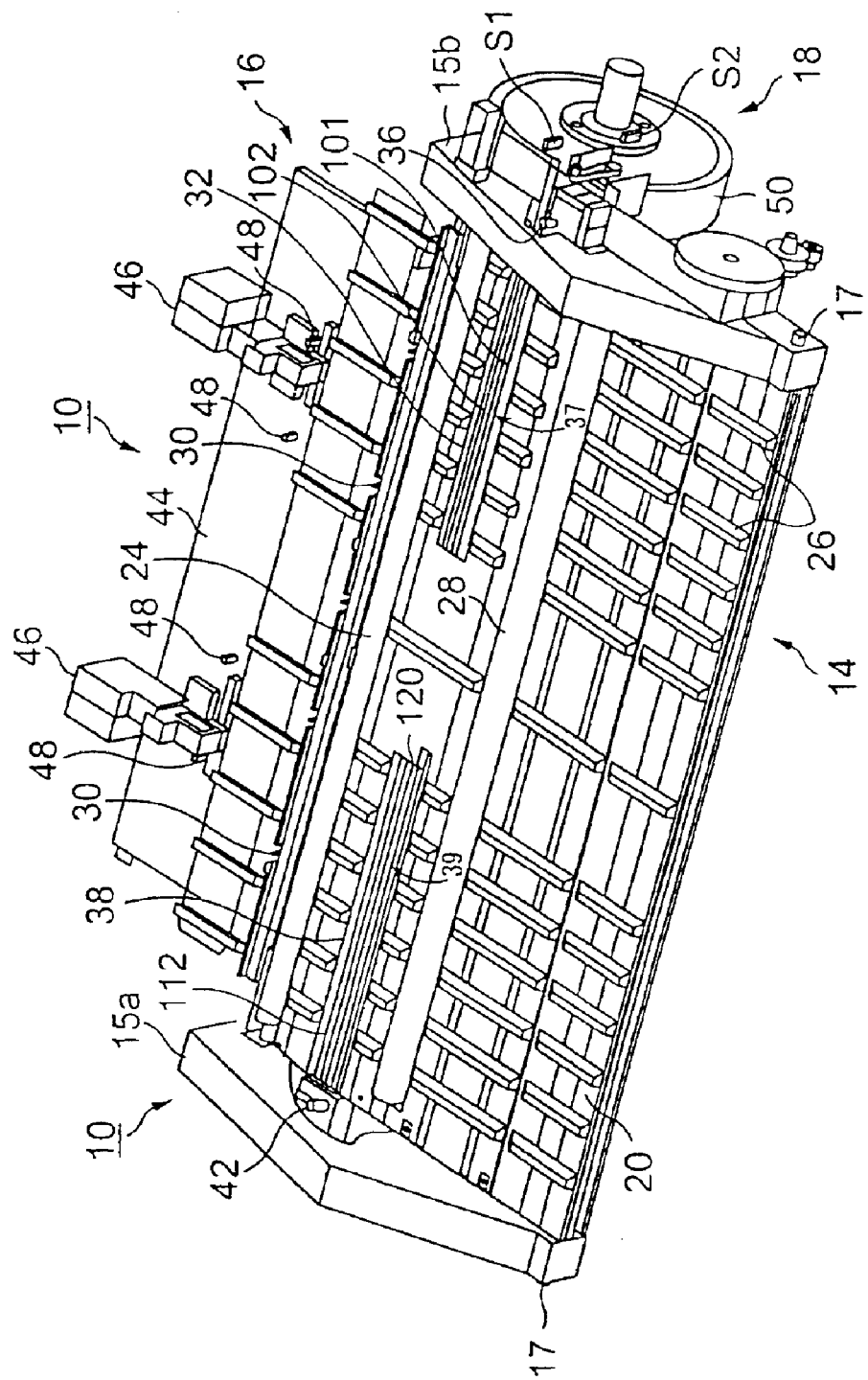
FIG. 2 is a perspective view of an image exposure apparatus according to an embodiment of the present invention, wherein a plate delivery guide is removed.
Figure 3:
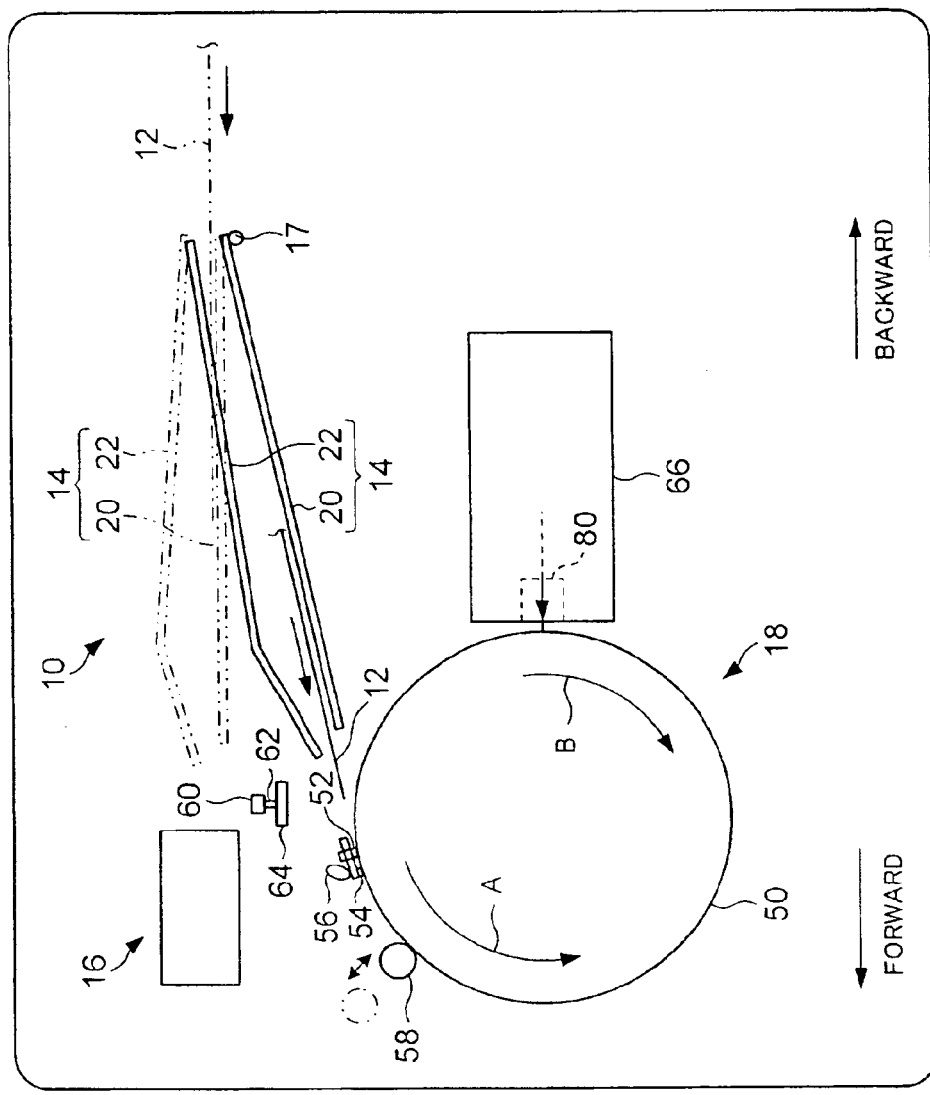
FIG. 3 is a schematic side view of an image exposure apparatus according to an embodiment of the present invention.

FIG. 1 is a perspective view of an image exposure apparatus 10 according to an embodiment of the present invention. FIG. 2 is a perspective view of an image exposure apparatus according to an embodiment of the present invention, wherein a plate delivery guide is removed. FIG. 3 is a schematic side view of an image exposure apparatus according to an embodiment of the present invention.

As shown in FIG. 1, FIG. 2 and FIG. 3, the image exposure apparatus 10 records (exposes) an image on an image forming layer (a sensitizing layer, an emulsion surface) of a printing plate 12 consisting of an aluminum foil sheet. In front of a conveying guide unit 14, there is disposed a punch section 16. And below the punch section 16, there is disposed an exposure section 18.

The conveying guide unit 14 comprises a plate feed guide 20 shaped as an approximately quadrilateral plate, a plate delivery guide 22 shaped as approximately quadrilateral plate, which is disposed on the upper portion of the plate feed guide 20, and left frame 15a and right frame 15b provided at both sides. As seen from FIG. 3, the relative position relation between the plate feed guide 20 and the plate delivery guide 22 offers an alphabetical V figure.

The conveying guide unit 14 rotatably moves by a predetermined angle on a fulcrum 17 provided on the rear end portion in FIG. 1 to FIG. 3. This rotatable movement makes it possible that the plate feed guide 20 and the plate delivery guide 22 selectively face the punch section 16 and the exposure section 18.

As shown in FIG. 2, at the front portion of the plate feed guide 20, there are provided cylindrical front conveying roller 24 and back conveying roller 28 in such a manner that they are rotatable and project onto the plate feed guide 20. When the front conveying roller 24 and back conveying roller 28 rotate, the printing plate 12 put on the plate feed guide 20 is conveyed forward. Further as shown in FIG. 1, also at the front portion of the plate delivery guide 22 there is provided a cylindrical conveying roller 29 in such a manner that it is rotatable and projects onto the plate delivery guide 22. When the conveying roller 29 rotates, the printing plate 12 put on the plate delivery guide 22 is conveyed backward.

As shown in FIG. 2, on the plate feed guide 20, there are provided a large number of trapezoidal columnar ribs 26. Those ribs 26 are disposed in parallel with respect to the lateral direction, and is set up in such a manner that height of the rib in projection onto the plate feed guide 20 is slightly lower than the front conveying roller 24. The use of the ribs 26 contributes to reduction of the frictional force involved in conveyance of the printing plate 12 by rotation of the conveying roller 28.

At the front of the plate feed guide 20, a plurality of provisional positioning pins 30 form a line in a horizontal direction. Each of the provisional positioning pins 30 is rotatable and projects over an upper surface of the plate feed guide 20 on a disappearing basis. As mentioned above, when the conveying roller 24 conveys the printing plate 12 forward, the front edge of the printing plate 12 bumps against the provisional positioning pins 30. Thus, a positioning of the front edge of the printing plate 12 is carried out. When the provisional positioning pins 30 go down, it is possible that the conveying roller 24 causes the printing plate 12 to be conveyed forward over the front edge of the plate feed guide 20. Thereafter, as will be mentioned later, positioning pins 48 of a punch unit 46 carries out regular positioning.

At the right side of the plate feed guide 20, there is formed a slit 32, which is substantially parallel with the conveying rollers 24 and 28 in the vicinity of the rear side of the conveying roller 24. Below the slit 32, there is disposed a reference pin moving unit 37 (cf. FIG. 4) in parallel with the slit 32.

Figure 4:
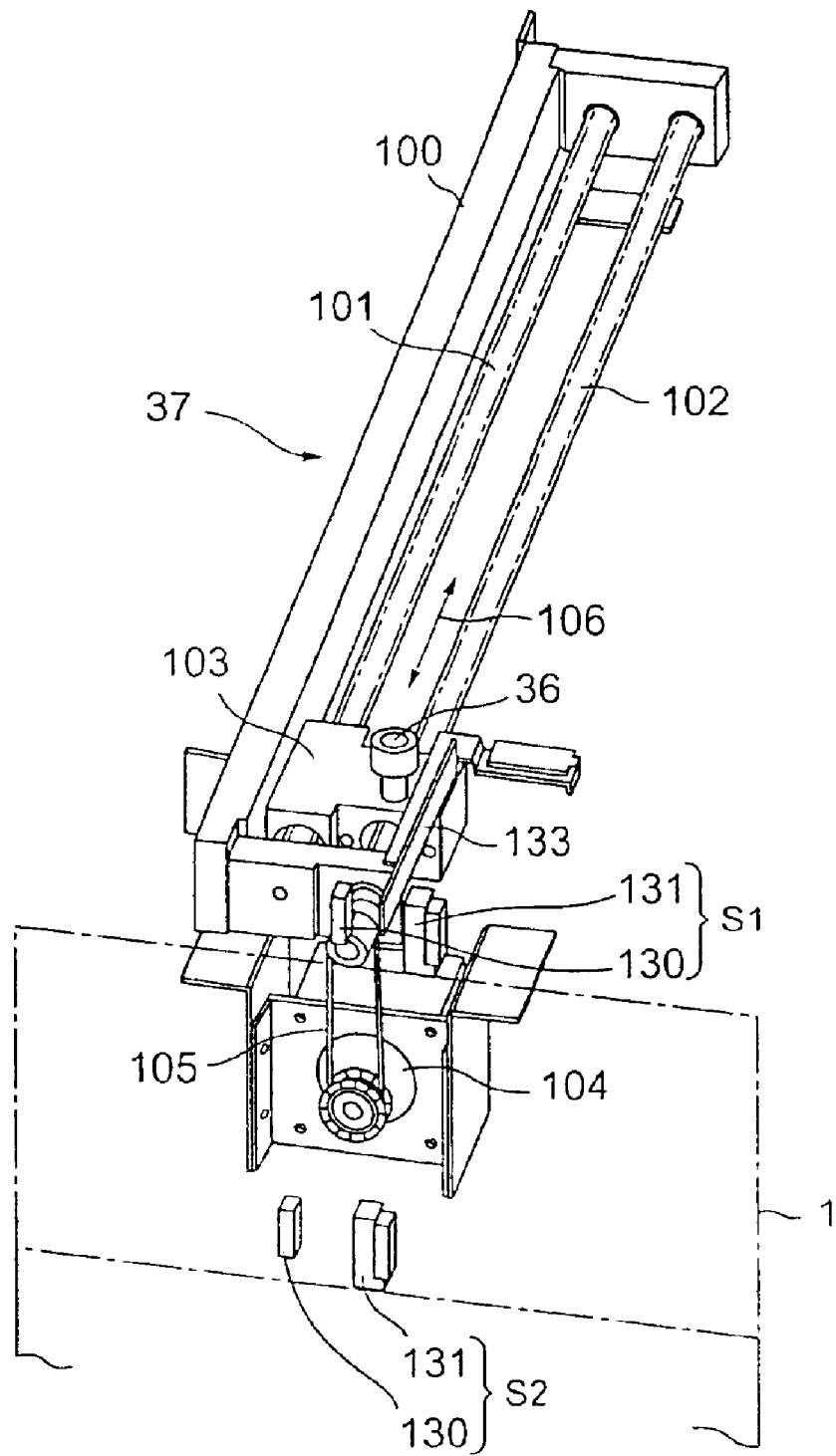
FIG. 4 is a perspective view of a reference pin-moving unit.

FIG. 4 is a perspective view of a reference pin moving unit 37. As shown in FIG. 4, the reference pin moving unit 37 comprises a guide member 101 fixed on a frame 100, and a feed screw 102 rotatably mounted on the frame 100, the feed screw 102 being in parallel to the guide member 101. A moving member 103 is slidably mounted on the guide member 101 and is screwed to the feed screw 102. A reference pin 36 is rotatably mounted on the top of the moving member 103 and projects over the slit 32. The feed screw 102 is driven by a driving motor 104 installed in the frame 100 via a timing belt 105, so that the moving member 103 reciprocates in an arrow 106 and the reference pin 36 reciprocates projecting from the slit 32.

The reference pin 36 is located at a home position of the right end of the plate feed guide 20 beforehand. A criterion of the right end of the printing plate 12 is determined in such a manner that the reference pin 36 moves from the home position to the left in accordance with a size of the printing plate 12 put on the plate feed guide 20.

Figure 8:
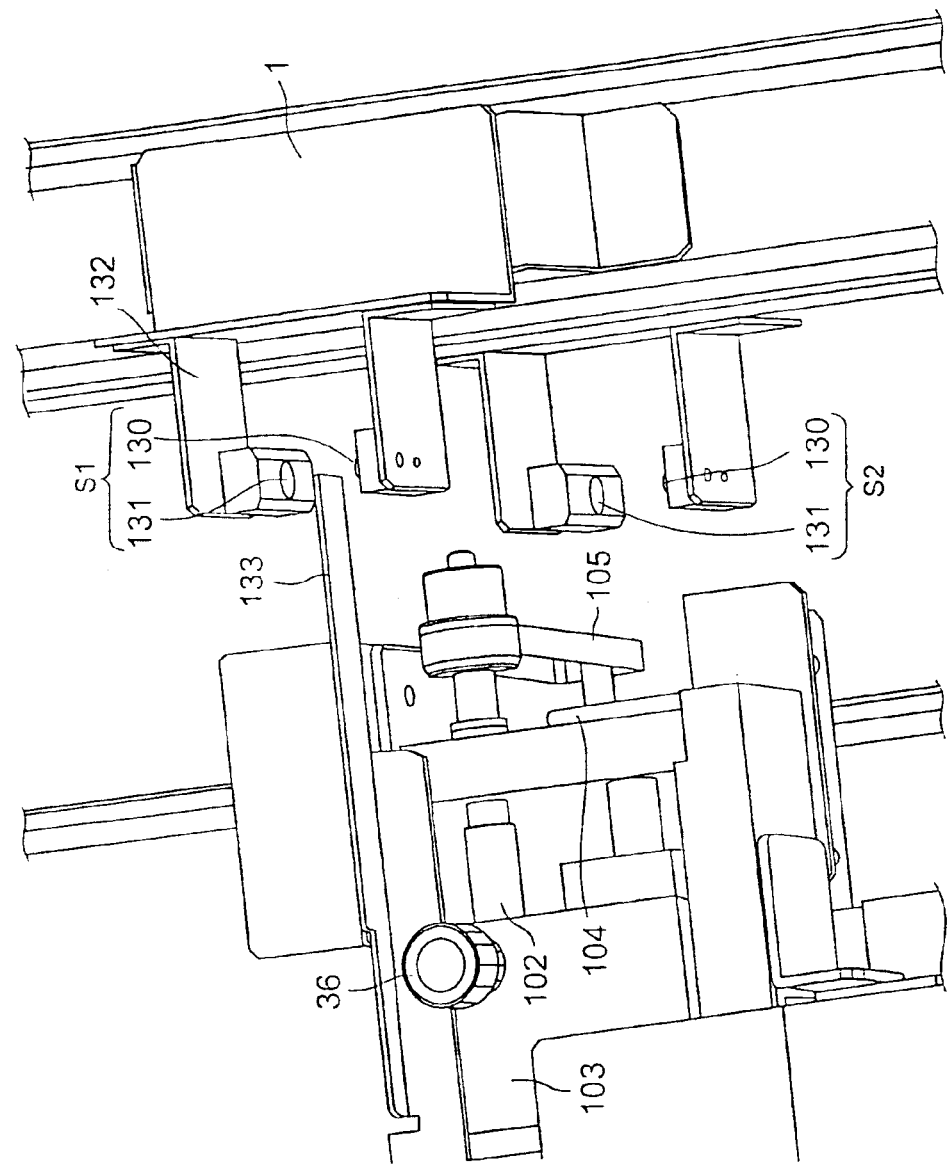
FIG. 8 is a perspective view of a home position sensor.
Figure 9:
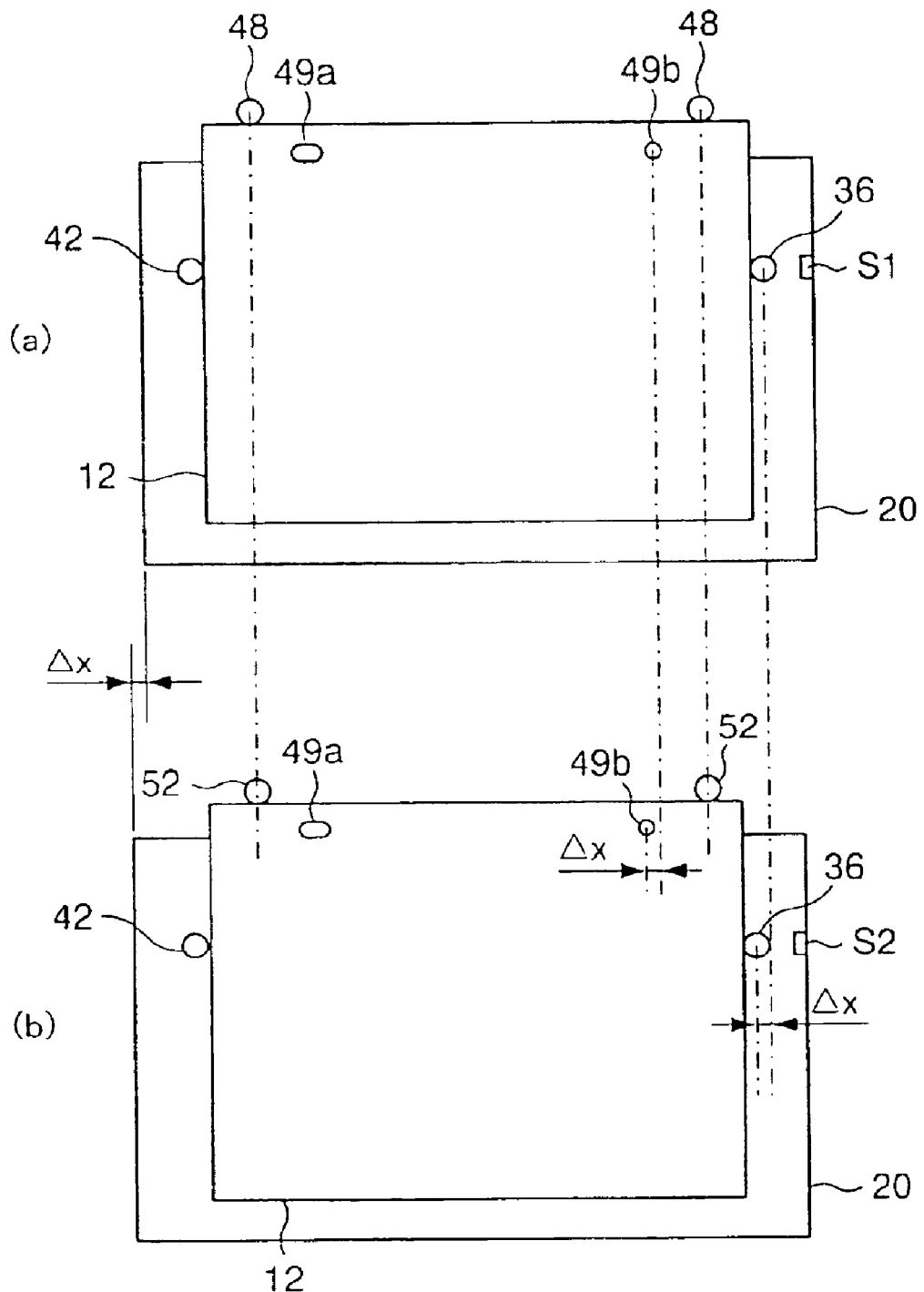
FIG. 9 is an explanatory view useful for understanding a step of positioning of a printing plate according to the related art.

FIG. 4 and FIG. 8 show layout structures of home position sensors for locating the reference pin 36 at the home position. Each of an upper home position sensor S1 and a lower home position sensor S2 comprises a light-emitting device 130 and a photocell 131. The light-emitting device 130 and the photocell 131 are fixed via a bracket 132 on a fixing portion 1 such as the main frame of the image exposure apparatus 10. The upper home position sensor S1 and the lower home position sensor S2 are disposed in such a manner that both the sensors S1 and S2 are located on the same vertical line. In the event that the relative position relation between the upper home position sensor S1 and the lower home position sensor S2 is grasped beforehand, it is acceptable that both the sensors S1 and S2 are not located on the same vertical line. In this case, movements from the upper home position sensor S1 and the lower home position sensor S2 are altered at a punch position and a drum opposed-position, which will be described later.

The fixing portion 1 is independent of the conveying guide unit 14. Any one is acceptable, as a fixing portion, which has no effect on the rotatable movement of the conveying guide unit 14. It is acceptable that for instance, dedicated poles are provided and the sensors S1 and S2 are installed in the dedicated poles, respectively.

A detection bracket 133, which extends in a substantially horizontal direction, is installed in the moving member 103 of the reference pin moving unit 37. When the detection bracket 133 enters between the light-emitting device 130 and the photocell 131, the photocell 131 turns, so that the home position of the reference pin 36 is detected in the manner as will be described later. The upper home position sensor S1 detects the home position where the conveying guide unit 14 is located at the punch position (the position depicted by the two-dot chain line in FIG. 3). The lower home position sensor S2 detects the home position where the conveying guide unit 14 is located at the supplying position (the position depicted by the solid line in FIG. 3) to the rotating drum 50.

Again referring to FIG. 2, at the left side of the plate feed guide 20, there is formed a slit 38 substantially in parallel to the front conveying roller 24 and the back conveying roller 28. Below the slit 38, there is disposed a width direction moving unit 39 (cf. FIG. 5) in parallel to the slit 38.

Figure 5:
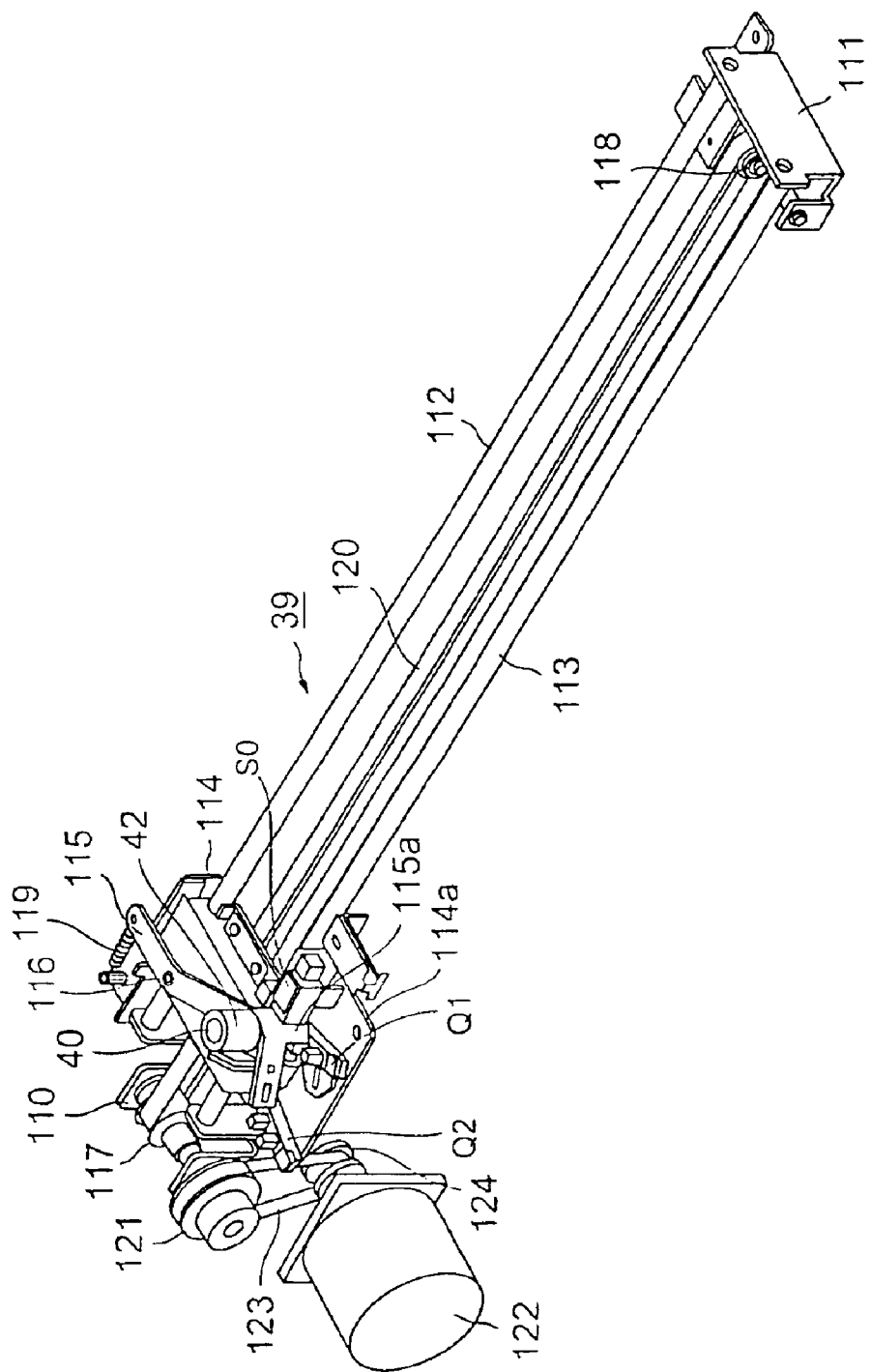
FIG. 5 is a perspective view of a width direction moving unit image exposure apparatus.

FIG. 5 is a perspective view of the width direction moving unit 39.

The width direction moving unit 39 comprises guide members 112 and 113 fixed between frames 110 and 111, and a moving member 114 which is movably mounted on the guide members 112 and 113. At the upper portion of the moving member 114, a connecting lever 115 is rotatably mounted on a fulcrum 116. A columnar conveying pin 42 is rotatably supported on a support shaft 40 of the connecting lever 115. The conveying pin 42 projects from the slit 38. A pressurizing spring 119 enables the connecting lever 115 anticlockwise in FIG. 5, that is, in a direction that the conveying pin 42 moves forward.

A timing belt 120 is built between pulleys 117 and 118 provided on the frames 110 and 111, respectively. The moving member 114 is fixed on the timing belt 120. A driving pulley 121 is installed in a shaft of the pulley 117 provided on the frame 111. A timing belt 123 is built between the driving pulley 121 and a motor pulley 124 of a driving motor 122 mounted on the frame 110.

Next, there will be explained an operation.

In FIG. 3, the conveying guide unit 14 goes up to the position depicted by the two-dot chain line. First, the printing plate 12 is put on the plate feed guide 20. At that time, it is acceptable that putting of the printing plate 12 on the plate feed guide 20 is carried out manually or on a basis of feeding by an automatic paper feeding unit. The printing plate 12 is put on the plate feed guide 20 in a relatively rough state. In this state, the conveying roller 24 conveys the printing plate 12 forward so that the front edge of the printing plate 12 bumps against the provisional positioning pins 30. Thereafter, the conveying pin 42 conveys the printing plate 12 in the right direction so that the printing plate 12 bumps against the reference pin 36. In this manner, the provisional positioning of the printing plate 12 is carried out. After the provisional positioning of the printing plate 12 is carried out, the conveying pin 42 goes back.

A punch section 16 has a predetermined number of punch units 46 (in this case, two punch units) provided on a supporting plate 44. When the plate feed guide 20 of the conveying guide unit 14 faces the punch units 46 and the provisional positioning pins 30 go down from the side of the plate feed guide 20, the printing plate 12 is conveyed into the punch units 46 by the conveying rollers 24 and 28.

At the front of each of the punch units 46, there is provided a positioning pins 48. The front edge of the printing plate 12, which is to be conveyed into the punch units 46, bumps the positioning pins 48, so that the position of the printing plate 12 in the front and back directions is determined. In this state, in other words, the state that while the conveying rollers 24 and 28 rotate, the printing plate 12 slips and is in contact with the positioning pins 48, the conveying pin 42 again moves so that the printing plate 12 is conveyed in the right direction to bump the reference pin 36. Thus, it is possible to determine a position of the printing plate 12 in the width direction. In this manner, as shown in the part (a) of FIG. 6, the punch section 16 carries out the regular positioning. The center line (as to the right and left direction) of the printing plate 12 thus carried out in the regular positioning is coincident with the center line (as to the right and left direction) of the plate feed guide 20.

Figure 6:
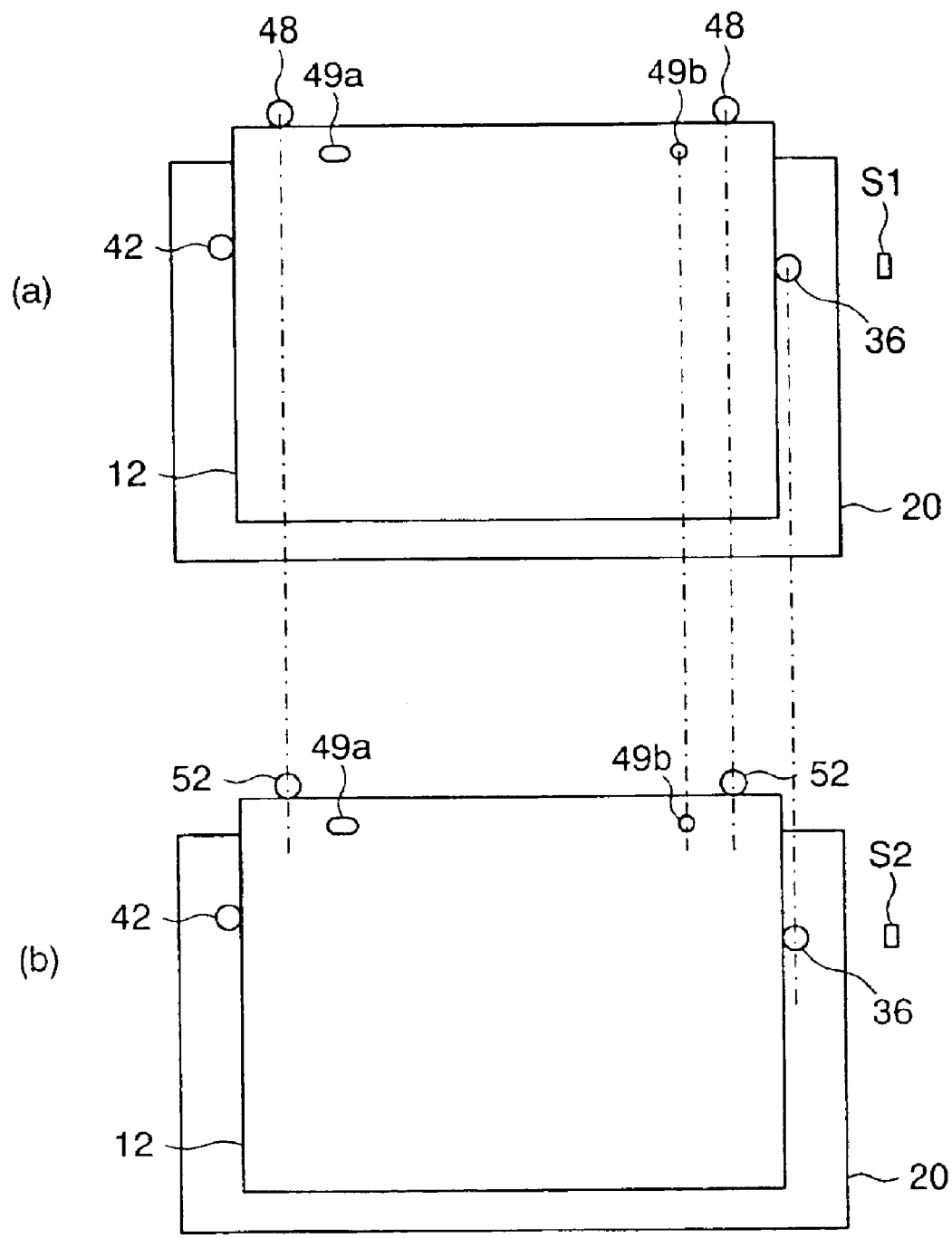
FIG. 6 is an explanatory view useful for understanding a step of positioning of a printing plate.

FIG. 6 is an explanatory view useful for understanding a step of positioning of a printing plate.

As shown in FIG. 6, at the front edge of the printing plate 12 subjected to the regular positioning, there are formed by the punch unit 46 a predetermined number of punched holes, for example, a slender punched hole 49a and a circular punched hole 49b. Those punched holes 49a and 49b are a criterion for winding the printing plate 12 around a plate cylinder of a rotary press of a printing apparatus (not illustrated), and are used for positioning in a printing processing in the printing apparatus.

When the punch unit 46 terminates the processing, the printing plate 12 is returned onto the plate feed guide 20 through the reverse rotation of the conveying roller 24, and the provisional positioning pins 30 project from the upper side so that the provisional positioning of the printing plate 12 is carried out in the manner as mentioned above.

Again referring to FIG. 1 and FIG. 2, the exposure section 18 is provided with a columnar rotating drum 50. When the provisional positioning of the printing plate 12, which is returned from the punch section 16 to the plate feed guide 20, is carried out in the manner as mentioned above, the conveying guide unit 14 goes down in the front edge and rotatably moves to the position depicted by the solid line in FIG. 3, so that the plate feed guide 20 is directed tangential to the rotating drum 50 and the provisional positioning pins 30 go down from the upper side of the plate feed guide 20. In this condition, the printing plate 12 (depicted by the solid line) is conveyed by the conveying roller 24 so that the front edge of the printing plate 12 is located at the periphery of the rotating drum 50.

Figure 7:
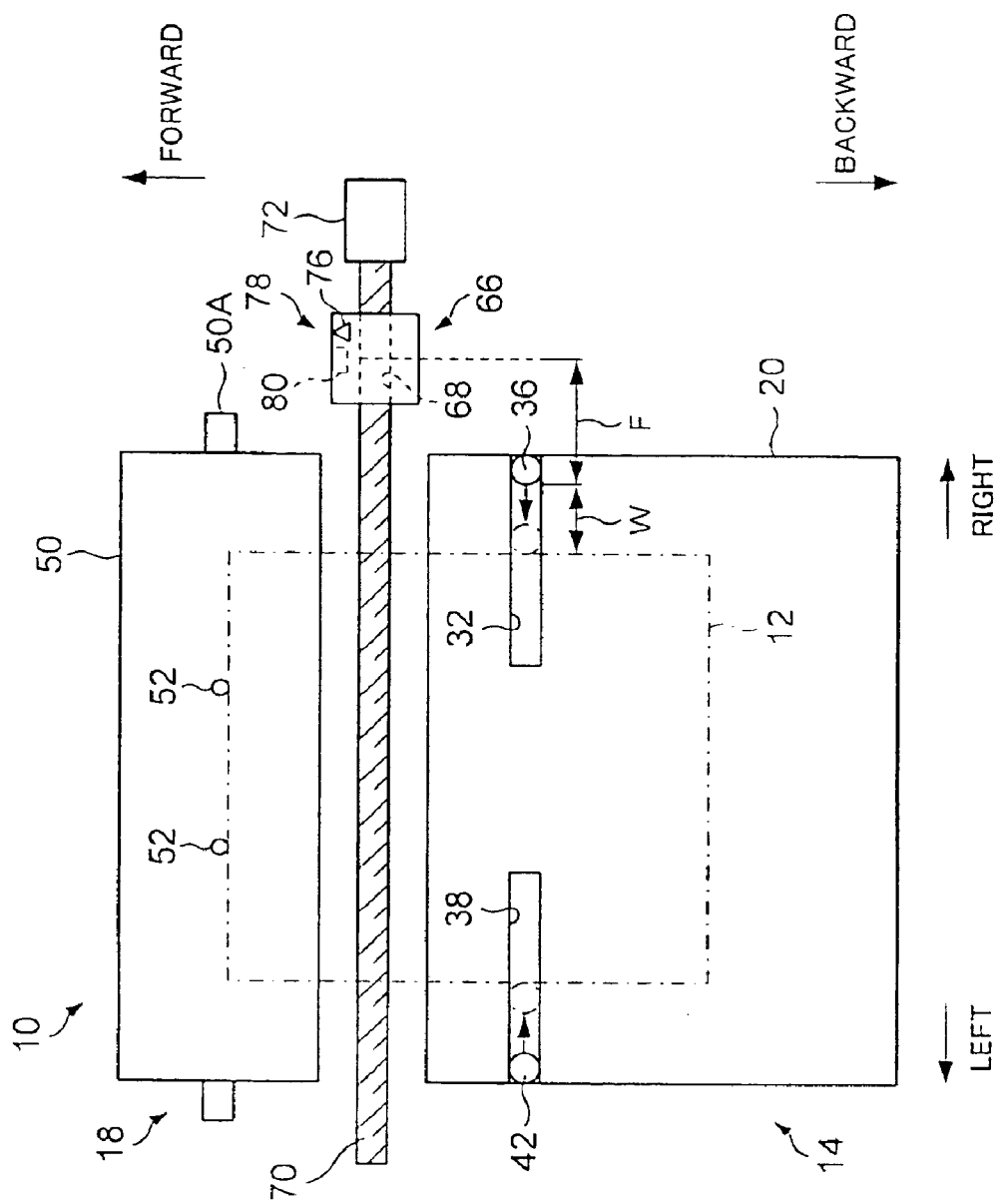
FIG. 7 is a plan view of essential portions of an image exposure apparatus according to an embodiment of the present invention.

FIG. 7 is a plan view of essential portions of an image exposure apparatus according to an embodiment of the present invention.

As shown in FIG. 7, on the periphery of the rotating drum 50 there are provided at least a pair of drum positioning pins 52. The front edge of the printing plate 12, which is conveyed onto the periphery of the rotating drum 50, bumps against the drum positioning pins 52, so that the position of the printing plate 12 in the front and back direction is determined. In this state, in other words, the state that while the conveying rollers 24 and 28, the printing plate 12 slips and is in contact with the positioning pins 48, the conveying pin 42 again moves so that the printing plate 12 is conveyed in the right direction to bump the reference pin 36. Thus, it is possible to determine a position of the printing plate 12 in the width direction. In this manner, as shown in the part (b) of FIG. 6, the exposure section 18 carries out the regular positioning.

Here, the position wherein the printing plate 12 bumps against a pair of positioning pins 48 and the reference pin 36 in the regular positioning by the punch section 16 and the position wherein the printing plate 12 bumps against a pair of positioning pins 52 and the reference pin 36 in the regular positioning by the exposure section 18 are set to the same position. For this reason, even if the edge portions of the printing plate 12 are concerned with a bend, it is possible to establish the coincidence between the regular positioning for the printing plate 12 by the punch section 16 and the regular positioning for the printing plate 12 by the exposure section 18. And thus it is possible to establish the coincidence between the printing position of the printing plate 12 determined by a predetermined number of punched holes and the exposure position (an image recording position) of the printing plate 12.

As shown in FIG. 3, on the periphery of the rotating drum 50 there is provided a front edge chuck 54 in the vicinity of the positioning pins 52. At the upper portion of the front edge chuck 54 there is provided a cam 56. When the cam 56 presses the front side of the front edge chuck 54, the rear side of the front edge chuck 54 is separated from the periphery of the rotating drum 50. Thus, as mentioned above, the front edge of the printing plate, which is conveyed from the plate feed guide 20 to the periphery of the rotating drum 50, is inserted between the rear side of the front edge chuck 54 and the periphery of the rotating drum 50. In this condition, the regular positioning for the printing plate 12 is carried out. After the regular positioning for the printing plate 12 is completed, the cam 56 rotatably moves to release the pressure of the front edge chuck 54, so that the rear side of the front edge chuck 54 rotatably moves by a spring (not illustrated) provided inside the front edge chuck 54. Thus, the front edge of the printing plate 12 is pressed so that the front edge of the printing plate 12 is maintained onto the periphery of the rotating drum 50. When the front edge of the printing plate 12 is maintained onto the periphery of the rotating drum 50, the rotating drum 50 is rotated in the direction of the arrow A in FIG. 2, so that the printing plate 12 is wound on the periphery of the rotating drum 50.

In the vicinity of the periphery of the rotating drum 50, there is disposed a squeeze roller 58, which is detachably in contact with the rotating drum 50, in the direction of the arrow A in FIG. 3 with respect to the cam 56. When the squeeze 58 moves to the side of the rotating drum 50, the squeeze 58 presses the printing plate 12, which is to be wound on the rotating drum 50, toward the rotating drum 50 and rotates, so that the printing plate 12 is closely in contact with the periphery of the printing plate 12.

In the vicinity of the periphery of the rotating drum 50, there is disposed a rear edge chuck detachable unit 60 in the direction of the arrow B in FIG. 3 with respect to the cam 56. The rear edge chuck detachable unit 60 has a shaft 62, which is movable to the rotating drum 50. A rear edge chuck 64 is mounted on the top of the shaft 62. When the rear edge of the printing plate 12 wound on the rotating drum 50 faces the rear edge chuck detachable unit 60, the shaft 62 causes the rear edge chuck 64 to move to the rotating drum 50 side so that the rear edge chuck 64 is mounted on a predetermined position of the rotating drum 50 and the rear edge chuck 64 is detached from the shaft 62. In this manner, the rear edge chuck 64 presses the rear edge of the printing plate 12, so that the rear edge of the printing plate 12 is maintained on the periphery of the rotating drum 50.

In this manner, when the front edge chuck 54 and the rear edge chuck 64 serve to maintain the front edge and the rear edge of the printing plate 12 on the rotating drum 50, the rotating drum 50 rotates at a predetermined rotating speed after the squeeze roller 58 is detached from the rotating drum 50.

As shown in FIG. 7, In the vicinity of the periphery of the rotating drum 50, there is disposed a recording head section 66 as an image recording section. The recording head section 66 is provided with a female screw 68. In the vicinity of the periphery of the rotating drum 50, there is disposed a feed screw 70 along the shaft line direction (the horizontal direction) of the rotating drum. One end (the right side in the present embodiment) of the feed screw 70 is coupled with a pulse motor 72 (a stepping motor), so that driving of the pulse motor 72 makes it possible that the feed screw 70 rotates. The female screw 68 of the recording head section 66 is engaged with the feed screw 70 on a spiral basis, so that the recording head section 66 is supported in a state that the recording head section 66 stands on the feed screw 70. When the feed screw 70 rotates by the drive of the pulse motor 72, the recording head section 66 moves in the shaft line direction of the rotating drum 50 maintaining the state that the recording head section 66 stands on the feed screw 70.

The recording head section 66 is provided with a head home position-detecting sensor 76. When the head home position-detecting sensor 76 detects a home position mark 78 which is disposed at a predetermined position in the vicinity of the rotating drum 50, the recording head section 66 is disposed on a home position.

In the recording head section 66, a light beam, which is modulated in accordance with the read image data, is projected from an irradiation lens 80 to the rotating drum 50 to be rotated at high speed in synchronism with the rotation of the rotating drum 50, so that the printing plate 12 is exposed in accordance with the image data. This exposure processing is a so-called scanning exposure processing that while the rotating drum 50 is rotated at high speed (the main scanning), the recording head section 66 is moved to the shaft line direction of the rotating drum 50 (the sub-scanning).

In this case, W+F=an initial migration length from the home position of the recording head section 66 to the left hand, where W denotes a distance wherein the reference pin 36 moves from the starting position (the right edge portion of the plate feed guide 20) to the left hand for positioning, and F denotes an offset amount of the irradiation lens 80 of the recording head section 66 disposed at the home position to the reference pin 36 disposed at the starting position to the right hand. Thus, the starting position (the exposure starting position) for image recording (depiction) of the printing plate is determined. Further, the rotating position of the rotating drum 50 is determined through computation of rotating position data by an encoder (not illustrated) disposed at a rotary shaft 50A of the rotating drum 50.

When the scanning exposure to the printing plate 12 is terminated, the rotating drum 50 temporarily stops in its rotating operation at the position that the rear edge chuck 64 faces the shaft 62 to remove the rear edge chuck 64 from the rotating drum 50, so that the pressure to the rear edge of the printing plate 12 by the rear edge chuck 64 is released. Further, after the conveying guide unit 14 rotatably moves and the plate delivery guide 22 is directed to the tangential direction to the rotating drum 50 as shown in FIG. 3, the rotating drum 50 rotates in the direction as indicated by the arrow B in FIG. 3. Thus, the printing plate 12 is delivered from the rear edge side to the plate delivery guide 22. At that time, the cam 56 rotatably moves to press the front side of the front edge chuck 54, so that the pressure to the front edge of the printing plate 12 by the back side of the front edge chuck 54 is released.

When the printing plate 12 is transmitted to the plate delivery guide 22, the conveying roller 29 rotatably moves to deliver the printing plate 12 from the plate delivery guide 22, so that the printing plate 12 is conveyed to a developing unit or a printing unit (not illustrated) involved in the subsequent step adjacent to the image exposure apparatus 10.

Next, there will be explained the operation of positioning of the printing plate 12.

The conveying guide unit 14 goes up the position depicted by the two-dot chain line in FIG. 3 (the initial state). First, size information such as length, width and thickness of the printing plate 12 is entered to control means (not illustrated), and then the printing plate 12 is put on the plate feed guide 20. At that time, it is acceptable that putting of the printing plate 12 on the plate feed guide 20 is carried out manually or on a basis of feeding by an automatic paper feeding unit. The printing plate 12 is put on the plate feed guide 20 in a relatively rough state. In this state, the conveying rollers 24 and 28 convey the printing plate 12 forward so that the front edge of the printing plate 12 bumps against the provisional positioning pins 30. Thereafter, the conveying rollers 24 and 28 rotate and the printing plate 12 slips.

In this condition, the reference pin 36 moves by the migration length computed in accordance with size information (width size information). More in detail, the driving motor 104 of the reference pin moving unit 37 is driven by an image recording start signal of the printing plate 12, so that the reference pin 36 and the detection bracket 133 enters from the right side in FIG. 7 via the timing belt 105, the feed screw 102 and the moving member 103 between the light-emitting device 130 of the upper home position sensor S1 and the photo-electric element 131 to turn on the photo-electric element 131. When the photo-electric element 131 turns on, the driving motor 104 reversely rotates so that the detection bracket 133 is removed from between the light-emitting device 130 of the upper home position sensor S1 and the photo-electric element 131. A position, wherein the detection bracket 133 is removed from between the light-emitting device 130 of the home position sensor S1 and the photo-electric element 131, is established as the home position of the reference pin 36.

Next, the driving motor 122 of the width direction moving unit 39 is driven to move the conveying pin 42 via the moving member 114, so that the printing plate 12 bumps the reference pin 36 and whereby the provisional positioning of the printing plate 12 is carried out.

In the state of the provisional positioning (the position depicted by the two-dot chain line in FIG. 3), the plate feed guide 20 of the conveying guide unit 14 faces the punch section 16; When the provisional positioning pins 30 go down from the upper side of the plate feed guide 20, the conveying rollers 24 and 28 convey the printing plate 12 forward so that the front edge of the printing plate 12 bumps a pair of positioning pins 48 of the punch section 16. Thereafter, the conveying rollers 24 and 28 rotate and the printing plate 12 slips. In this state, the reference pin 36 moves by the migration length computed in accordance with the size information (width size information) in the manner as mentioned above to set up the reference position. Next, the conveying pin 42 conveys the printing plate 12 to the right hand. When the printing plate 12 bumps the reference pin 36, the punch section 16 carries out the regular positioning in the state that the printing plate 12 is put on the plate feed guide 20. That is, the positioning for the printing plate 12 is carried out with three points of a pair of positioning pins 48 and the reference pin 36.

After the punch unit 46 forms a predetermined number of punched holes on the front edge of the printing plate 12 thus determined in positioning, the printing plate 12 is returned onto the plate feed guide 20 through the reverse rotation of the conveying roller 24, and a pair of provisional positioning pins 30 is projected from the upper side of the plate feed guide 20. Thus, the provisional positioning for the printing plate 12 is carried out in a similar fashion to that as mentioned above.

In the state of the provisional positioning, the conveying guide unit 14 rotates so that the plate feed guide 20 is associated with the exposure section 18 (the position depicted by the solid line), and a pair of provisional positioning pins 30 goes down from the upper side of the plate feed guide 20. Then the conveying roller 24 conveys the printing plate 12 forward so that the front edge of the printing plate 12 bumps a pair of positioning pins 52 of the rotating drum 50. Thereafter, the conveying rollers 24 and 28 rotate and the printing plate 12 slips.

In this state, the reference pin 36 moves by the migration length computed in accordance with size information (width size information). More in detail, the driving motor 104 of the reference pin moving unit 37 is driven by an image recording start signal of the printing plate 12, so that the reference pin 36 and the detection bracket 133 enters from the right side in FIG. 7 via the timing belt 105, the feed screw 102 and the moving member 103 between the light-emitting device 130 of the lower home position sensor S2 and the photo-electric element 131 to turn on the photo-electric element 131. When the photo-electric element 131 turns on, the driving motor 104 reversely rotates so that the detection bracket 133 is removed from between the light-emitting device 130 of the upper home position sensor S1 and the photo-electric element 131. A position, wherein the detection bracket 133 is removed from between the light-emitting device 130 of the lower home position sensor S2 and the photo-electric element 131, is established as the home position of the reference pin 36 in the drum position.

In this state, the conveying pin 42 conveys the printing plate 12 to the right hand. When the printing plate 12 bumps the reference pin 36, the exposure section 18 carries out the regular positioning in the state that the printing plate 12 is put on the plate feed guide 20. That is, the positioning for the printing plate 12 is carried out with three points of a pair of positioning pins 52 and the reference pin 36.

Thereafter, the recording is carried out in such a manner that the recording head section 66 is moved while the printing plate 12 is wound on the drum 50 (the explanation will be omitted).

According to the present embodiment, as mentioned above, the home position sensors S1 and S2 for detecting the starting position of the reference pin 36 are mounted on the external fixing portion 1, but not on the conveying guide unit 14. Thus, an image exposure apparatus according to the present invention is independent of a rotatable movement of the conveying guide unit 14, and accordingly, it is possible to always set up the same starting position or the home position, and thus in the event that the rotating drum 50 is used to perform a recording on a plurality of printing plates 12, it is possible to make sure of image position reproduction quality with greater accuracy.

Incidentally, according to the present embodiment, the conveying guide unit 14 is rotatably and movably supported via the shaft 17. However, it is acceptable to provide such an arrangement that the conveying guide unit 14 is moved in a vertical direction by a guide rail (not illustrated). In case of such an arrangement, it is effective that the angle setting of the conveying guide unit 14 is replaced by the position setting.

As mentioned above, according to the present invention, the home position sensors S1 and S2, which detect the home position of the reference pin, are mounted on the fixing portion independent of the conveying guide unit. Thus, an image exposure apparatus according to the present invention has no effect on the rotatable movement of the conveying guide unit. Accordingly, it is possible to exactly set up the home position of the reference pin regardless of the mechanical errors of the conveying guide unit, and also to make sure of the reproduction quality of image positions to punched holes for positioning in the printing processing by the printing apparatus on the printing plate, and thereby ensuring the reproduction quality of image positions of the printing plates by the rotating drum with greater accuracy.

Although the present invention has been described with reference to the particular illustrative embodiments, it is not to be restricted by those embodiments but only by the appended claims. It is to be appreciated that those skilled in the art can change or modify the embodiments without departing from the scope and sprit of the present invention.

What is claimed is:

1. An image exposure apparatus comprising:
   a rotating drum for winding a printing plate on which an image is recorded;
   a punch unit for forming punched holes to be used for positioning in printing processing on the printing plate;
   a conveying guide unit having a guide section that selectively moves to a first position facing the punch unit and a second position facing the rotating drum to guide a printing plate to the selected position so as to supply the printing plate;
   a pair of first positioning pins against which a front edge of the printing plate bumps when the conveying guide unit is located at the first position;
   a pair of second positioning pins against which the front edge of the printing plate bumps when the conveying guide unit is located at the second position;

a width direction moving unit for moving in a width direction while a conveying pin is in contact with a width direction edge of the printing plate that is put on the conveying guide unit;

a reference pin moving unit having a reference pin disposed at an opposite side of the width direction moving unit for defining the width direction edge of the printing plate, the reference pin moving unit moving the reference pin in accordance with a size of the printing plate; and a home position sensor mounted on a fixing portion independently of the conveying guide unit for detecting a home position of the reference pin.

2. An image exposure apparatus according to claim 1, wherein the home position sensor comprises a first home position sensor for detecting the home position of the reference pin where the conveying guide unit is located at the first position, and a second home position sensor for detecting the home position of the reference pin where the conveying guide unit is located at the second position.

3. An image exposure apparatus according to claim 1, wherein the reference pin carries out a positioning for the printing plate with three points including the first positioning pin in cooperation with the first positioning pin when the conveying guide unit is located at the first position.

4. An image exposure apparatus according to claim 1, wherein the reference pin carries out a positioning for the printing plate with three points including the second positioning pin in cooperation with the second positioning pin when the conveying guide unit is located at the second position.

5. An image exposure apparatus according to claim 1, wherein the reference pin moves a position in which a relative position to the first positioning pin when the conveying guide unit is located at the first position is equal to a relative position to the second positioning pin when the conveying guide unit is located at the second position.

* * * * *